(12) United States Patent
Ishizuka

(10) Patent No.: US 11,894,858 B2
(45) Date of Patent: Feb. 6, 2024

(54) A/D CONVERSION DEVICE AND A/D CONVERSION METHOD

(71) Applicant: YAMAHA CORPORATION, Hamamatsu (JP)

(72) Inventor: Kenji Ishizuka, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 321 days.

(21) Appl. No.: 17/477,712

(22) Filed: Sep. 17, 2021

(65) Prior Publication Data

US 2022/0006468 A1    Jan. 6, 2022

Related U.S. Application Data

(63) Continuation of application No. PCT/JP2020/005453, filed on Feb. 13, 2020.

(30) Foreign Application Priority Data

Mar. 20, 2019  (JP) .................................. 2019-052618

(51) Int. Cl.
*H03M 1/38* (2006.01)
*H03M 1/18* (2006.01)
(Continued)

(52) U.S. Cl.
CPC ............ *H03M 1/183* (2013.01); *H03G 3/301* (2013.01); *H03G 7/004* (2013.01); *H03M 1/18* (2013.01)

(58) Field of Classification Search
CPC ......... H03M 1/183; H03G 3/301; H03G 3/30; H03G 7/004
(Continued)

(56) References Cited

U.S. PATENT DOCUMENTS 5,808,575 A     9/1998  Himeno
9,008,334 B2    4/2015  Ayres
(Continued)

FOREIGN PATENT DOCUMENTS

| JP | S6465927 A   | 3/1989  |
| JP | H05315962 A  | 11/1993 |
| JP | H05343994 A  | 12/1993 |
| JP | H06260861 A  | 9/1994  |
| JP | H09130245 A  | 5/1997  |
| JP | 2017175215 A | 9/2017  |

OTHER PUBLICATIONS

International Search Report issued in International Appln. No. PCT/JP2020/005453 dated Mar. 31, 2020. English translation provided.

(Continued)

*Primary Examiner* — Peguy Jean Pierre
(74) *Attorney, Agent, or Firm* — ROSSI, KIMMS & McDOWELL LLP

(57) ABSTRACT

An amplifier performs analog amplification on a signal I_A with a gain corresponding to a state GS and outputs the amplified signal as a signal M_A. An ADC converts the signal M_A to a digital signal and outputs the digital signal as a signal M_D. Analog comparators and a down-determination unit detect that the signal M_A exceeds a first level, and cause the state GS to transition to a state of gain of the next lower stage. Digital comparators and an up-determination unit detect that the signal M_D has been continuously lower than a second level for a predetermined period, and cause the state GS to transition to a state of gain of the next higher stage. The restoration circuit performs digital amplification on the signal M_D with a gain corresponding to the gain of the amplifier and outputs the amplified signal as a signal O_D.

20 Claims, 6 Drawing Sheets

(51) Int. Cl.
*H03G 3/30* (2006.01)
*H03G 7/00* (2006.01)

(58) Field of Classification Search
USPC .......................................... 341/120, 118, 139
See application file for complete search history.

(56) References Cited

U.S. PATENT DOCUMENTS

| | | | |
|---|---|---|---|
| 2008/0063220 A1* | 3/2008 | Lin | ......................... H03G 3/30 |
| | | | 381/120 |
| 2012/0076246 A1 | 3/2012 | Okada et al. | |
| 2015/0162924 A1 | 6/2015 | Takaike et al. | |
| 2017/0346461 A1 | 11/2017 | Corbishley | |

OTHER PUBLICATIONS

Written Opinion issued in International Appln. No. PCT/JP2020/005453 dated Mar. 31, 2020.

Extended European search report issued in European Appln. No. 20773718.0 dated Nov. 17, 2022.

English translation of Written Opinion issued in International Appln. No. PCT/JP2020/005453 dated Mar. 31, 2020, previously cited in IDS filed Sep. 17, 2021.

International Preliminary Report on Patentability issued in International Appln. No. PCT/JP2020/005453 dated Sep. 30, 2021 English translation provided.

* cited by examiner

A/D CONVERSION DEVICE AND A/D CONVERSION METHOD

CROSS REFERENCE TO RELATED APPLICATIONS

The present application is a continuation application of International Application No. PCT/JP2020/005453, filed Feb. 13, 2020, which claims priority to Japanese Patent Application No. 2019-052618, filed Mar. 20, 2019. The contents of these applications are incorporated herein by reference in their entirety.

BACKGROUND

The present invention relates to an analog to digital (A/D) conversion device and an A/D conversion method for converting an analog audio signal to a digital audio signal.

In a floating-point A/D conversion device, a variable-gain amplifier is provided at a stage prior to an ADC (Analog Digital Converter) and switching of the gain of the variable-gain amplifier is controlled such that the level of input to the ADC does not become higher than an upper limit or lower than a lower limit.

In a floating-point A/D conversion device described in U.S. Pat. No. 9,008,334 (herein after referred as "Patent Literature 1"), the gain of the variable-gain amplifier is switched according to a digital sample that is output from the ADC. Also, in a floating-point A/D conversion device described in JP 2017-175215A (hereafter referred as "Patent Literature 2"), the gain of the variable-gain amplifier is switched according to an analog signal that is input to the ADC.

SUMMARY

The floating-point A/D conversion device described in Patent Literature 1 switches the gain based on an output from the ADC, and accordingly, there is a problem in that, if a change occurs in the level of input to the ADC that necessitates switching of the gain, switching of the gain of the variable-gain amplifier is delayed due to a delay in the ADC.

Also, the floating-point A/D conversion device described in Patent Literature 2 requires an analog circuit that compares the level of an analog signal with a first level to perform control for reducing the gain of the variable-gain amplifier, an analog comparator that compares the level of the analog signal with a second level to perform control for increasing the gain, and an analog circuit that generates the first level and the second level, and there is a problem in that the circuit has a complex configuration and is large.

Also, the floating-point A/D conversion device described in Patent Literature 2 determines the gain of the variable-gain amplifier according to the voltage of the analog signal during a period from when the analog signal is sampled and held to when the ADC performs A/D conversion on the analog signal. Accordingly, the gain is immediately increased if the absolute value of the sampled and held analog signal is small (close to a zero level), and there is a problem in that gain switching for increasing the gain is frequently performed and sound degradation due to the gain switching frequently occurs.

The present invention was made in view of the above circumstances and has an object of providing an A/D conversion device with which it is possible to make the gain of a variable-gain amplifier immediately follow a level change in an analog signal and to prevent frequent gain switching, without making an analog circuit large.

The present invention provides an A/D conversion device that includes: an amplifier configured to perform analog amplification on a first analog signal with a gain corresponding to a state and output the amplified signal as a second analog signal; a converter configured to convert the second analog signal to a digital signal and output the digital signal as a first digital signal; a down circuit configured to detect that the second analog signal exceeds a range defined with a first level and cause the state to transition to a state of gain of the next lower stage; and an up circuit configured to detect that the first digital signal has been continuously within a range defined with a second level for a predetermined period and cause the state to transition to a state of gain of the next higher stage, an absolute value of the second level being smaller than an absolute value of the first level.

DETAILED DESCRIPTION

The following describes embodiments of the present invention with reference to the drawings.

First Embodiment

Figure 1:
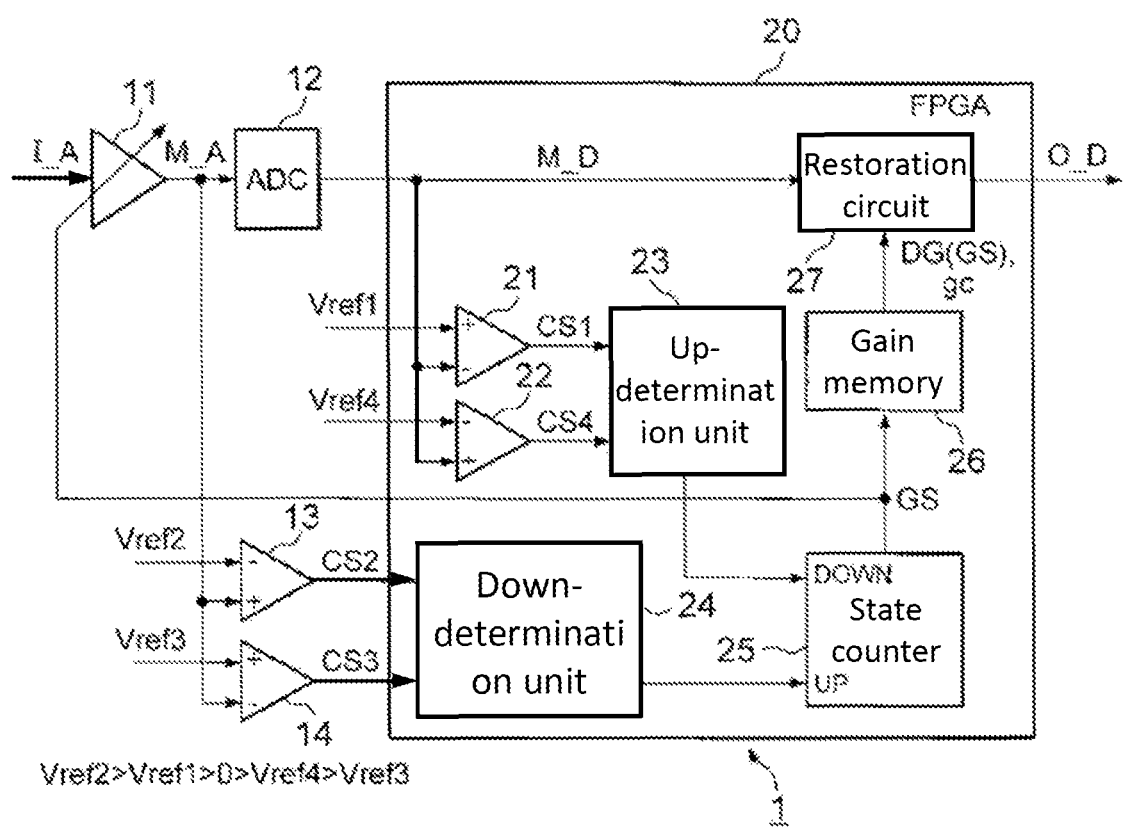
FIG. 1 is a block diagram showing a configuration of an A/D conversion device, which is a first embodiment of the present invention.

FIG. 1 is a block diagram showing a configuration of an A/D conversion device 1, which is a first embodiment of the present invention. The device 1 includes an amplifier 11, an ADC 12, analog comparators 13 and 14, and an FPGA (Field Programmable Gate Array) 20. The device 1 receives an analog signal I_A (first analog signal) as an audio signal, converts the analog signal I_A to a digital signal O_D, and outputs the digital signal O_D to a signal processing device (e.g., a signal processing unit shown in FIG. 3) that performs signal processing on the digital signal O_D.

The amplifier 11 is a variable-gain amplifier that amplifies the analog signal I_A input to the A/D conversion device 1 with an analog gain corresponding to a current state GS (gain state) and outputs the amplified analog signal M_A (second analog signal). Here, the state GS indicates a stage of gain of the amplifier 11 specified by the FPGA 20, and in the present embodiment, the gain increases as the state GS increases.

The ADC 12 is a converter that converts the output amplified analog signal M_A to a digital signal M_D (first digital signal) and output the digital signal M_D.

Vref2 and Vref3 of a first level are respectively given to the analog comparators 13 and 14. Here, Vref2 and Vref3 are reference levels for determining whether or not to reduce the gain of the amplifier 11, and Vref2 is a reference level on the plus side and Vref3 is a reference level on the minus side. If the voltage of the signal M_A is higher than Vref2, the analog comparator 13 outputs an H level as a signal CS2, but otherwise the analog comparator 13 outputs an L level as the signal CS2. If the voltage of the signal M_A is lower than Vref3, the analog comparator 14 outputs an H level as a signal CS3, but otherwise the analog comparator 14 outputs an L level as the signal CS3.

As shown in FIG. 1, the FPGA 20 is programmed to function as digital comparators 21 and 22, an up-determination unit 23, a down-determination unit 24, a state counter 25, a gain memory 26, and a restoration circuit 27.

The state counter 25 is an up-down counter in which the current state GS is stored and that raises the state GS by one in response to an up instruction and immediately lowers the state GS by one in response to a down instruction. An operation for increasing the gain may be delayed from the up instruction to a certain extent. The state GS stored in the state counter 25 is supplied to the amplifier 11 described above and is used to control the gain.

Vref1 and Vref4 of a second level are respectively given to the digital comparators 21 and 22. Here, Vref1 and Vref4 are digital values that represent reference levels for determining whether or not to increase the gain of the amplifier 11. When it is assumed that the analog signal M_A and the digital signal M_D obtained by converting the analog signal M_A are at the same level, there is a relationship Vref2>Vref1>0>Vref4>Vref3 between the levels Vref1 and Vref4 and the levels Vref2 and Vref3 described above. That is, an absolute value of the second level is smaller than an absolute value of the first level.

If the value of the signal M_D is smaller than Vref1, the digital comparator 21 outputs an H level as a signal CS1, but otherwise the digital comparator 21 outputs an L level as the signal CS1. Also, if the value of the signal M_D is larger than Vref4, the digital comparator 22 outputs an H level as a signal CS4, but otherwise the digital comparator 22 outputs an L level as the signal CS4.

If both of the signals CS1 and CS4 have continuously stayed at the H level for a predetermined period, i.e., if the level of the signal M_D has been continuously kept between Vref1 and Vref4 for the predetermined period, the up-determination unit 23 transmits an up instruction to the state counter 25 to raise the state GS by one.

The digital comparators 21 and 22 and the up-determination unit 23 constitute an up circuit that detects that the value of the first digital signal M_D has been continuously within the range defined by the second level (the range from Vref4 to Vref1) for the predetermined period and causes the state counter 25 to increase the state GS to a next higher state corresponding to a one-step higher gain than the current gain of the amplifier 11. That is, the up circuit switches the gain AG of the amplifier 11 to a gain of a next higher stage if positive and negative peak values of a received audio signal continuously do not reach positive and negative reference values (positive: Vref1/AG(GS), negative: Vref4/AG(GS)) specified with the current state GS, respectively. However, the maximum value of the state GS in the state counter 25 is 7, and the state GS cannot be raised to a state above 7.

If either the signal CS2 or the signal CS3 reaches the H level, the down-determination unit 24 transmits a down instruction to the state counter 25 to lower the state GS by one. The down-determination unit 24 and the analog comparators 13 and 14 described above constitute a down circuit that detects that the voltage of the second analog signal (output amplified analog signal) M_A exceeds the range defined by the first level from Vref3 to Vref2 and causes the state counter 25 to lower the state GS transition to a next lower state corresponding to a one-step lower gain than a current gain of the amplifier 11. The down-determination unit 24 is a low-delay digital circuit that immediately changes the state GS according to outputs from the analog comparators 13 and 14. That is, the down circuit switches the gain AG of the amplifier 11 to a gain of the next lower stage at the moment at which either a positive peak value or a negative peak value of a received audio signal moves out of the range between positive and negative reference values (positive: Vref2/AG(GS), negative: Vref3/AG(GS)) specified with the current state GS. However, the minimum value of the state GS in the state counter 25 is 0, and the state GS cannot be lowered to a state below 0.

The gain memory 26 is a memory that supplies a digital gain value DG(GS) that corresponds to the current state GS stored in the state counter 25 to the restoration circuit 27 at a timing delayed by a delay amount that corresponds to a delay of the audio signal in the ADC 12. The restoration circuit 27 amplifies the digital signal M_D with the gain DG(GS) and outputs the amplified digital signal as a signal O_D (second digital signal).

Inherently, there are variations in the gain of the amplifier 11 in each state specified with the state GS due to variations in analog elements such as a resistor. In the present embodiment, measures are taken in the gain memory 26 to correct a gain error that occurs in the signal O_D due to an error between a design value of the gain of the amplifier 11 and an actual gain.

Here, assume that an error ΔG occurs between a design value G of the gain of the amplifier 11 corresponding to a state and an actual analog gain of the amplifier 11, and the analog gain is G+ΔG. In this case, if digital amplification is performed on the signal M_D in the restoration circuit 27 with a gain 1/G without the error being taken into consideration, a total gain O_D/I_A is (G+ΔG)/G. The error ΔG differs between amplifiers and states, and may be a positive value or a negative value. Therefore, the total gain varies every time the state is switched, and noise that distorts the signal O_D in a stepwise manner occurs at a point in time at which the state is switched. Therefore, in the present embodiment, when the A/D conversion device 1 is manufactured, the manufacturer measures analog gains AG(GS) of the amplifier 11 for respective states GS, calculates gains DG(GS) for the respective states GS based on the analog gains, and writes a gain table that includes the gains DG(GS) for the plurality of states GS into the gain memory 26. That is, the gain memory 26 stores a gain value that corresponds to an analog gain of the amplifier 11 for each state GS.

Figure 2:
FIG. 2 is a diagram showing a gain table in the A/D conversion device.

FIG. 2 is a diagram showing the gain table. As shown in FIG. 2, a gain DG(GS)=BG−AG(GS) of the restoration circuit 27 for each state GS, which is calculated from a measured analog gain AG(GS), is stored in the gain table. Here, BG represents a base gain, and the manufacturer can determine a gain suitable for signal processing that is to be performed at a following stage as the base gain. In FIG. 2, analog gains AG(GS) are shown as "about 60 dB" and the like because there are variations in the analog gains of the amplifier 11 as described above.

In the example shown in FIG. 2, the gains AG(GS) are set at intervals of 10 dB, but this is merely an example of design. Gains AG(GS) may also be set at other intervals or intervals may also be changed at an intermediate stage.

Also, in the example shown in FIG. 2, the gain AG(GS) increases as the value of the state GS increases, but, conversely, the gain AG(GS) may also decrease as the value of the state GS increases. In this case, the up instruction and the down instruction are interchanged in FIG. 1.

Also, a variation range of the state GS (range from GS=0 to GS=5 in the example shown in FIG. 2) may be limited according to an instruction from a user or due to a setting. For example, if it is known that a signal (a signal of a line level) for which high gain is not needed will be input to the A/D conversion device 1, unnecessary gain switching can be reduced by setting an upper limit of the variation range of the state GS. Details of this limitation will be described later in relation to FIG. 6.

When the gain of the amplifier 11 is switched, transient noise occurs in addition to noise due to an error of the analog gain of the amplifier 11. Therefore, in the present embodiment, when the state GS is switched, the gain memory 26 transmits a signal gc that indicates the timing of the switching to the restoration circuit 27. The restoration circuit 27 amplifies the signal M_D with the gain DG(GS) and performs calculation to reduce transient noise included in the amplified signal M_D' at a timing corresponding to the signal gc. The restoration circuit 27 obtains a signal O_D that is to be output from the device 1 by replacing, with an interpolation sample, a sample of the amplified signal M_D' within a period during which the transient noise due to switching of the gain appears in the signal M_D, more specifically, within a predetermined period from the output timing of the signal gc. The interpolation sample is calculated based on the signal M_D' before and after the period. Thus, it is possible to reduce the transient noise that occurs in the signal O_D due to switching of the gain of the amplifier 11. The transient noise can be reduced using not only such a replacement method but also a noise reduction filter according to characteristics of the transient noise. For example, a configuration is also possible in which, out of a series of samples of the signal M_D', a sample of the transient noise within a period during which the transient noise is included is predicted based on samples before the period, and the predicted noise is removed.

Next, operations and effects of the present embodiment will be described. In the present embodiment, comparison with the first level for determining to reduce the gain of the amplifier 11, which needs to be performed at high speed, is performed using the second analog signal M_A before A/D conversion. If the audio signal exceeds the range defined with the first level, a determination to reduce the gain can be made at high speed to prevent clipping of the audio signal in the ADC 12.

On the other hand, comparison with the second level for determining to increase the gain of the amplifier 11, which need not be performed at high speed, is performed through digital comparison using the signal M_D after A/D conversion. The digital comparison is realized using only a portion of a digital processing circuit such as an existing FPGA. On the other hand, analog comparators and an analog circuit that generates the second level are omitted from the A/D conversion device 1, and therefore the cost and power consumption of the entire device can be reduced.

Also, in the present embodiment, the state GS is caused to transition to the state of gain of the next higher stage when it is detected that the audio signal (signal M_D) has been continuously within the range of the second level for the predetermined period. The gain of the amplifier 11 is not increased even if the audio signal (signal M_D) is small for a short period, and frequent switching of the gain can be prevented.

Also, according to the present embodiment, a plurality of gains DG(GS) that correspond to measurement values of the gain of the amplifier 11 in a plurality of states are stored in the gain memory 26. Also, the restoration circuit 27 amplifies the signal M_D with a gain DG(GS) that is stored in the gain memory 26 and corresponds to the current state GS, and outputs the amplified signal as the signal O_D. Therefore, even if the state is switched in the A/D conversion device 1, the gain of the audio signal (i.e., signal O_D/signal I_A) in the entire device 1 does not vary.

Also, in the present embodiment, the restoration circuit 27 reduces the transient noise in a series of samples of the signal M_D amplified with the gain DG(GS), and therefore the output signal O_D includes almost no transient noise even if the gain of the amplifier 11 is switched.

Application Example

Figure 3:
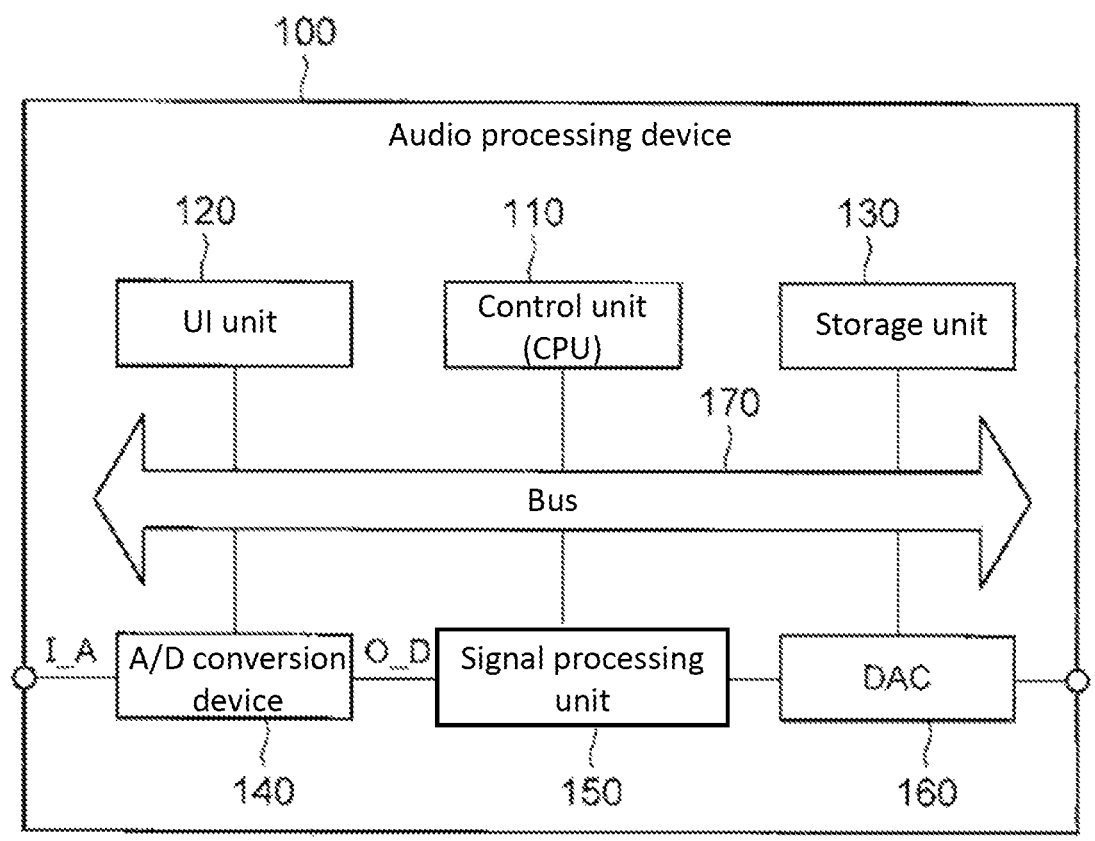
FIG. 3 is a block diagram showing a configuration of an audio processing device that includes the A/D conversion device.

FIG. 3 is a block diagram showing an example configuration of an audio processing device 100 that includes the same A/D conversion device as that described above. The audio processing device 100 is, for example, a digital mixer, a signal processing engine, an audio device, an electronic musical instrument, an effector, a PC, a smartphone, or a tablet terminal. The audio processing device 100 may be any device that receives an analog audio signal, converts the analog signal to a digital signal, and processes the digital signal.

As shown in FIG. 3, the audio processing device 100 includes a control unit 110, a UI (User Interface) unit 120, a storage unit 130, an A/D conversion device 140, a signal processing unit 150, a DAC (Digital Analog Converter) 160, and a bus 170 that connects these elements to each other.

The control unit 110 is a control circuit that controls the entire audio processing device 100 and is constituted by one or more CPUs, for example. The UI unit 120 includes an operation unit that supplies information regarding an operation made by a user to the control unit 110 in response to the operation and a display unit that visually provides information from the control unit 110 to the user, for example. The storage unit 130 stores programs that are executed by the control unit 110, control information that is used by the control unit 110, and the like. The A/D conversion device 140 is the same circuit as the device 1 shown in FIG. 1 and converts an analog audio signal I_A to a digital audio signal O_D. The signal processing unit 150 performs signal processing according to an instruction from the control unit 110 on the audio signal O_D output from the A/D conversion device 140 and outputs the processed audio signal to the DAC 160. The DAC 160 converts the digital audio signal output from the signal processing unit 150 to an analog audio signal and outputs the analog signal to a sound emission device such as a powered speaker on the outside of the audio processing device 100.

The A/D conversion device 140 of this application example includes four registers R1 to R4 (not shown) in which values of the reference levels Vref1 to Vref4 are stored and a register UL (not shown) in which an upper limit value of the variation range of the state GS is stored. Setting values of the registers R1 and R4 are supplied as Vref1 and Vref4 to the digital comparators 21 and 22 shown in FIG. 1. Setting values of the registers R2 and R3 are converted to analog voltages Vref2 and Vref3 by a D/A converter (not shown) and are supplied to the analog comparators 13 and 14. A setting value of the register UL limits the range in which the state GS varies in the device 1.

Figure 4:
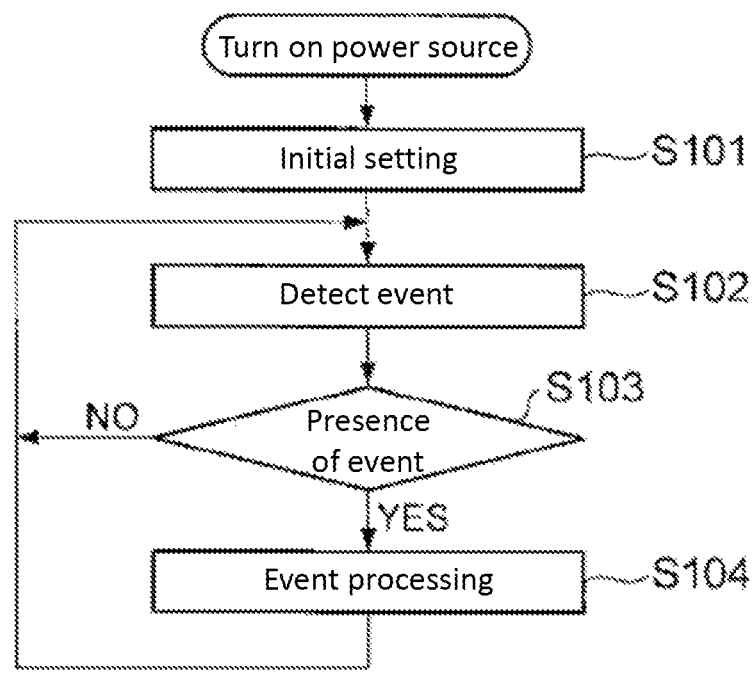
FIG. 4 is a flowchart showing an operation of the audio processing device.
Figure 5:
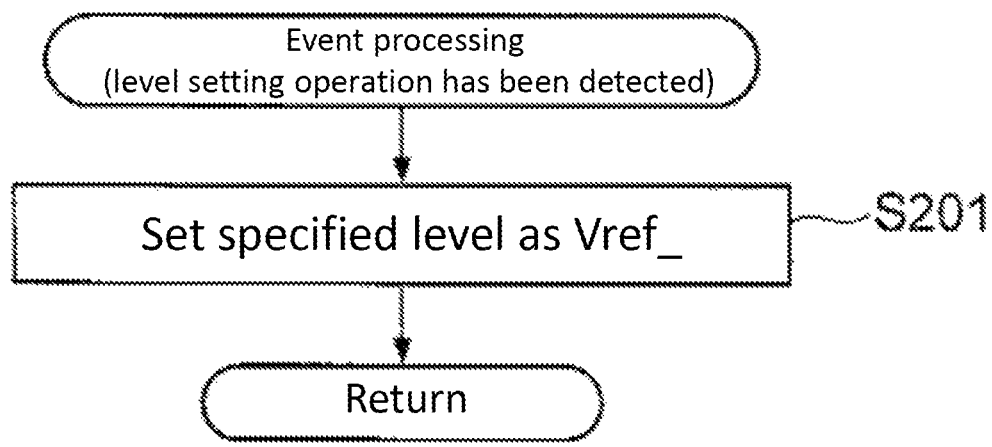
FIG. 5 is a flowchart showing an operation of the audio processing device.
Figure 6:
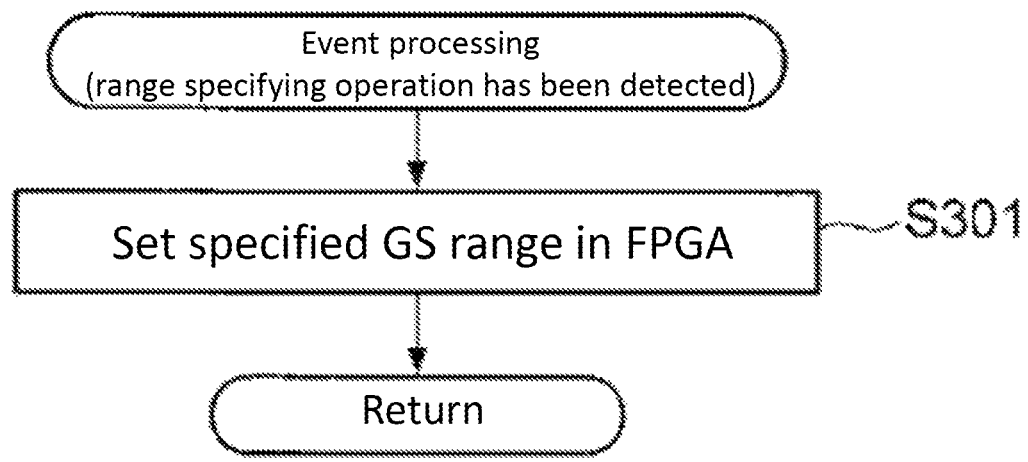
FIG. 6 is a flowchart showing an operation of the audio processing device.

FIGS. 4 to 6 are flowcharts showing processing contents of a program that is executed by the control unit 110 in this application example. When the power source of the audio processing device 100 is turned ON, the control unit 110 reads a main routine shown in the flowchart of FIG. 4 from the storage unit 130 and executes the routine.

First, the control unit 110 executes initial setting (step S101). In the initial setting, the control unit 110 reads a program that is to be caused to function as the FPGA 20 shown in FIG. 1 from the storage unit 130 and writes the program into an FPGA of the A/D conversion device 140.

Next, the control unit 110 detects various events that occur in the audio processing device 100 (step S102) and determines the presence or absence of these events (step S103).

If it is determined in step S103 that no event has occurred, the control unit 110 repeats detection of the events (step S102) and determination of the presence or absence of the events (step S103).

On the other hand, if it is determined in step S103 that an event has occurred, the control unit 110 executes event processing corresponding to the detected event (step S104), and thereafter repeats detection of the events (step S102) and determination of the presence or absence of the events (step S103).

FIG. 5 is a flowchart of event processing that is executed in step S104 upon detection of an operation event indicating that the user has made an operation to change the value of any one of the reference levels Vref1 to Vref4. In this event processing, out of the registers R1 to R4, a register that corresponds to the specified reference level is set to a value that corresponds to the operation. Thus, out of Vref1 to Vref4 shown in FIG. 1, a reference level that corresponds to the set register is changed to a level that corresponds to the set value.

FIG. 6 is a flowchart of event processing that is executed in step S104 upon detection of an operation event indicating that the user has made an operation to set the variation range of the state GS. In this event processing, an upper limit (5 in the example shown in FIG. 2) of the variation range of the state that the user specified by operating the UI unit 120 is set in the register UL in the A/D conversion device 140. When the register UL is set, the upper limit value indicated by the register UL serves as the maximum value of the state GS in the state counter 25. If the current state GS reaches the upper limit value indicated by the UL, the state counter 25 does not raise the state GS even when an up instruction is received.

Second Embodiment

In the A/D conversion device of the first embodiment, the FPGA 20 functions as the up circuit, but the up circuit need not operate at high speed, and therefore the control unit 110 shown in FIG. 3 functions as the up circuit in the second embodiment.

The configuration of the A/D conversion device according to the second embodiment is essentially the same as that shown in FIG. 1 but the FPGA 20 does not include the up circuit (the comparators 21 and 22 and the up-determination unit 23). The control unit 110 functions as the up circuit by reading a program shown in FIG. 7 from the storage unit 130 and executing the program. Also, the registers R1, R4, and UL can be omitted from the A/D conversion device, and the A/D conversion device includes the registers R2 and R3, registers Rmax and Rmin for giving the maximum value and the minimum value of the signal M_D to the control unit 110, and a register S for receiving an up signal from the control unit 110.

Figure 7:
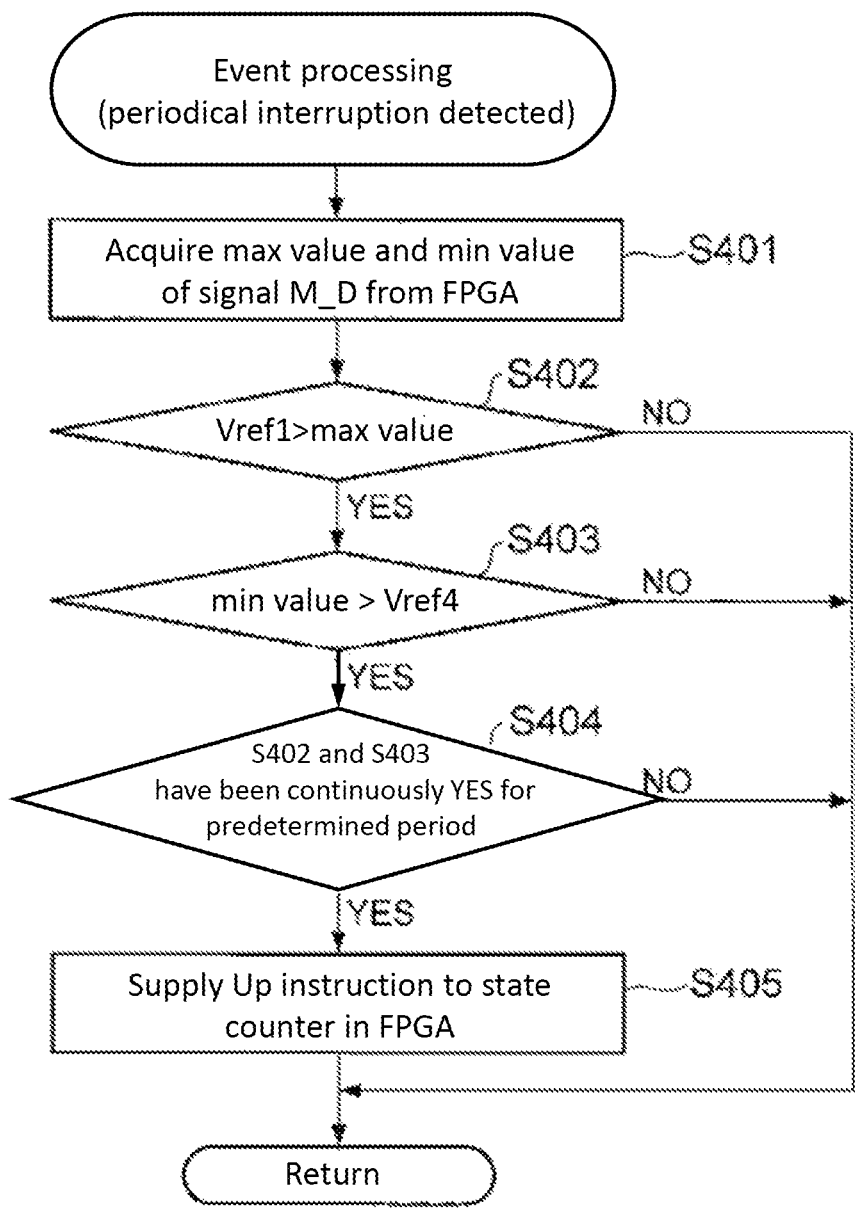
FIG. 7 is a flowchart showing an operation according to a second embodiment of the present invention.

FIG. 7 is a flowchart of interruption processing that is executed in step S104 upon detection of an interruption event of a timer that periodically occurs. In this interruption processing, the control unit 110 first acquires a max value and a min value of the signal M_D that occurred between previous interruption processing and current interruption processing from the registers Rmax and Rmin in the A/D conversion device 140 (step S401).

Next, the control unit 110 determines whether or not the reference level Vref1 is larger than the max value (step S402), and if the result of determination is "NO", ends the event processing routine. If the result of determination performed in step S402 is "YES", the control unit 110 determines whether or not the min value is larger than the reference level Vref4 (step S403), and if the result of determination is "NO", ends the event processing routine. If the result of determination performed in step S403 is "YES", the control unit 110 determines whether or not results of determination performed in steps S402 and S403 have been continuously "YES" for a predetermined period, and if the result of determination is "NO", ends the event processing routine. It is possible to provide a measurement counter and measure the duration for which the results are "YES" as a count value of the counter, for example. More specifically, if the result of determination performed in step S403 is "YES" in both of the previous interruption processing and the current interruption processing, the counter is incremented, and if the result is "NO" in the previous interruption processing and "YES" in the current interruption processing, the counter is reset to 1. In this case, the duration is measured as a count value of the measurement counter. Accordingly, when the count value has reached a predetermined value, it can be determined that results of determination performed in steps S402 and S403 have been continuously "YES" for the predetermined period.

If the result of determination performed in step S404 is "YES", i.e., if the signal M_D has stayed at a level between Vref4 and Vref1 for the predetermined period, the control unit 110 writes an up instruction into the register S (step S405), and ends the event processing routine. In response to the up instruction to the register S, the state counter 25 of the A/D conversion device changes the state GS to a state of gain of the next higher stage. However, if a down instruction is given from the down circuit during a period from when the max value and the min value are read in step S401 to when the up instruction is given in step S405, the state counter 25 ignores the up instruction and does not change the state GS.

As described above, in the present embodiment, the functions of the digital comparators 21 and 22 and the up-determination unit 23 in the above-described first embodiment are realized as a result of the control unit 110 executing the program.

Effects similar to those achieved in the above-described first embodiment are also achieved in the present embodiment. Also, in the present embodiment, the control unit 110 performs up determination, and therefore there is an advantage in that it is easy to dynamically change conditions for the up determination such as the reference levels and the predetermined period.

Although the first embodiment and the second embodiment of the present invention have been described, other embodiments of the present invention are also possible. The following are examples.

(1) Out of the four reference levels, Vref2 and Vref3 may be set to levels that have the same absolute value and opposite polarities. Likewise, Vref1 and Vref4 may be set to levels that have the same absolute value and opposite polarities. Thus, the four registers R1 to R4 can be reduced to two registers (e.g., R1 and R2).

(2) In the above-described first embodiment, control for reducing the gain by a single state is performed based on comparison between the signal M_A and the first level, but, instead of the signal M_A, a signal that is obtained by performing full wave rectification on the signal M_A may be compared with the first level. Also, in the above-described first embodiment, control for increasing the gain by a single state is performed based on comparison between the signal M_D and the second level, but, instead of the signal M_D, a signal that is obtained by performing full wave rectification on the signal M_D may be compared with the second level. In these cases, it is possible to halve the number of analog comparators used in the former comparison and the number of digital comparators used in the latter comparison, but a response time on the negative side becomes longer than a response time on the positive side in the analog comparator.

| List of Reference Numerals | | | |
|---|---|---|---|
| 1, 140 | A/D conversion device | 11 | Amplifier |
| 12 | ADC | 13, 14 | Analog comparator 20 FPGA |
| 21, 22 | Digital comparator | 23 | Up-determination unit |
| 24 | Down-determination unit | 25 | State counter |
| 26 | Gain memory | 27 | Restoration circuit |
| 100 | Audio processing device | 110 | Control unit |
| 120 | UI unit | 130 | Storage unit |
| 140 | A/D conversion device | 150 | Signal processing unit |
| 160 | DAC | 170 | Bus |

The invention claimed is:

1. An analog to digital (A/D) conversion device comprising:
an amplifier configured to amplify an input analog signal with an analog gain corresponding to a gain state and output the amplified analog signal;
a converter configured to convert the output amplified analog signal to a digital signal and output the digital signal;
a down circuit configured to;
detect the output amplified analog signal exceeding a range defined by a first level: and
upon detecting that the output amplified analog signal exceeds the range defined by the first level, lower bring the gain state to a next lower state corresponding to a one-step lower gain than a current gain of the amplifier; and an up circuit configured to;
detect the output digital signal having been continuously within a range defined by a second level for a predetermined period; and
upon detecting that the output digital signal has been continuously within the range defined by the second level for the predetermined period, increase the gain state to a next higher state corresponding to a one-step higher gain than the current gain of the amplifier,
wherein an absolute value of the second level is smaller than an absolute value of the first level.

2. The A/D conversion device according to claim 1, wherein
the down circuit includes an analog comparator that compares the output amplified analog signal with the first level.

3. The A/D conversion device according to claim 2, wherein
the down circuit further includes a low-delay digital circuit that changes the gain state according to an output from the analog comparator.

4. The A/D conversion device according to claim 3, further comprising
a restoration circuit configured to amplify the output digital signal with a digital gain corresponding to the analog gain of the amplifier and outputs the amplified digital signal.

5. The A/D conversion device according to claim 4, further comprising
a memory storing a gain value that corresponds to an analog gain of the amplifier for each state, and
the restoration circuit amplifies the output digital signal with the digital gain corresponding to a gain value stored in the memory and corresponding to the current gain state, and outputs the amplified digital signal.

6. The A/D conversion device according to claim 4, wherein the restoration circuit is further configured to reduce influence of transient noise in the output digital signal on the amplified digital signal, the transient noise occurring at a timing of transition of the gain state.

7. The A/D conversion device according to claim 6, wherein
the restoration circuit reduces the influence of the noise on the amplified digital signal by replacing, among a series of samples of the output digital signal, a sample in which the transient noise is included with an interpolation sample.

8. The A/D conversion device according to claim 6, wherein
the restoration circuit reduces the transient noise using a noise reduction filter.

9. The A/D conversion device according to claim 2, further comprising
a restoration circuit configured to amplify the output digital signal with a digital gain corresponding to the analog gain of the amplifier and outputs the amplified digital signal.

10. The A/D conversion device according to claim 9, further comprising
a memory storing a gain value that corresponds to an analog gain of the amplifier for each state, and
the restoration circuit amplifies the output digital signal with the digital gain corresponding to a gain value stored in the memory and corresponding to the current gain state, and outputs the amplified digital signal.

11. The A/D conversion device according to claim 9, wherein the restoration circuit is further configured to reduce influence of transient noise in the output digital signal on the amplified digital signal, the transient noise occurring at a timing of transition of the gain state.

12. The A/D conversion device according to claim 11, wherein
the restoration circuit reduces the influence of the noise on the amplified digital signal by replacing, among a series of samples of the output digital signal, a sample in which the transient noise is included with an interpolation sample.

13. The A/D conversion device according to claim 11, wherein
the restoration circuit reduces the transient noise using a noise reduction filter.

14. The A/D conversion device according to claim 1, further comprising
a restoration circuit configured to amplify the output digital signal with a digital gain corresponding to the analog gain of the amplifier and outputs the amplified digital signal.

15. The A/D conversion device according to claim 14, further comprising
a memory storing a gain value that corresponds to an analog gain of the amplifier for each state, and
the restoration circuit amplifies the output digital signal with the digital gain corresponding to a gain value stored in the memory and corresponding to the current gain state, and outputs the amplified digital signal.

16. The A/D conversion device according to claim 14, wherein the restoration circuit is further configured to reduce influence of transient noise in the output digital signal on the amplified output digital signal, the transient noise occurring at a timing of transition of the gain state.

17. The A/D conversion device according to claim 16, wherein the restoration circuit reduces the influence of the noise on the amplified digital signal by replacing, among a series of samples of the output digital signal, a sample in which the transient noise is included with an interpolation sample.

18. The A/D conversion device according to claim 16, wherein
the restoration circuit reduces the transient noise using a noise reduction filter.

19. An analog to digital (A/D) conversion device comprising:
an amplifier configured to amplify an input analog signal with an analog gain corresponding to a gain state and output the amplified analog signal;
a converter configured to convert the output amplified analog signal to a digital signal and output the digital signal;
at least one memory storing instruction; and
at least one processor that implements the instructions to:
detect the output amplified analog signal exceeding a range defined by a first level; and upon detecting that the output amplified analog signal exceeds the range defined by the first level, lower the gain state to a next lower state corresponding to a one-step lower gain than a current gain of the amplifier;
detect the output digital signal having been continuously within a range defined by a second level for a predetermined period; and
upon detecting that the output digital signal has been continuously within the range defined by the second level for the predetermined period, increase the gain state to a next higher state corresponding to a one-step higher gain than the current gain of the amplifier, wherein an absolute value of the second level is smaller than an absolute value of the first level.

20. A non-transitory memory storing a program executable by a computer of an analog to digital A/D conversion device that includes an amplifier configured to amplify an input analog signal with an analog gain corresponding to a gain state and outputs the amplified analog signal, and a converter that converts the output amplified analog signal to a digital signal and outputs the digital signal, the method comprising:
detecting the output amplified analog signal exceeding a range defined by a first level;
upon detecting that the output amplified analog signal exceeds the range defined by the first level, lowering the gain state to a next lower state corresponding to a one-step lower gain than a current gain of the amplifier;
detecting the output digital signal having been continuously within a range defined by a second level for a predetermined period; and
upon detecting that the output digital signal has been continuously within the range defined by the second level for the predetermined period, increasing the gain state to a next higher state corresponding to a one-step higher gain than the current gain of the amplifier,
wherein an absolute value of the second level is smaller than an absolute value of the first level.

* * * * *